United States Patent [19]

McDougall

[11] 3,876,473

[45] Apr. 8, 1975

[54] METHOD OF FABRICATING A COMPOSITE INTERMETALLIC-TYPE SUPERCONDUCTOR

[75] Inventor: Ian Leitch McDougall, Aldridge, England

[73] Assignee: Imperial Metal Industries (Kynoch) Limited, Birmingham, England

[22] Filed: Jan. 8, 1974

[21] Appl. No.: 431,721

[30] Foreign Application Priority Data

Jan. 26, 1973 United Kingdom................ 4133/73

[52] U.S. Cl............... 148/11.5 R; 29/599; 148/127; 174/126 CP; 174/DIG. 6

[51] Int. Cl........................................... H01v 11/14

[58] Field of Search.......... 148/11.5 R, 127; 29/599; 174/DIG. 6, 126 CP; 335/216

[56] References Cited

UNITED STATES PATENTS

| | | | |
|---|---|---|---|
| 3,625,662 | 12/1971 | Roberts et al. | 29/599 X |
| 3,665,595 | 5/1972 | Tanaka et al. | 29/599 |
| 3,728,165 | 4/1973 | Howlett | 148/11.5 R |
| 3,731,374 | 5/1973 | Suenaga et al. | 29/599 |
| 3,737,824 | 6/1973 | Coles | 174/DIG. 6 |
| 3,778,894 | 12/1973 | Kono et al. | 29/599 |
| 3,807,041 | 4/1974 | McDougall | 29/599 |
| 3,813,764 | 6/1974 | Tanaka et al. | 174/126 CP X |

*Primary Examiner*—C. W. Lanham
*Assistant Examiner*—D. C. Reiley, III
*Attorney, Agent, or Firm*—Cushman, Darby & Cushman

[57] ABSTRACT

In a method of manufacturing a superconductor of intermetallic compound which includes the steps of forming an assembly of one component of the eventually intermetallic superconductive compound surrounded by and in intimate contact with a non-superconductive material and diffusing the remaining component of the compound through the non-superconductive material, the improvement which comprises providing a selective diffusion barrier between the one component and the non-superconductive material to substantially block the passage of the non-superconductive material into the one component.

19 Claims, 5 Drawing Figures

METHOD OF FABRICATING A COMPOSITE INTERMETALLIC-TYPE SUPERCONDUCTOR

BACKGROUND OF THE INVENTION

This invention relates to superconductors and has particular but not exclusive reference to superconductors having good superconductive properties.

The production of intermetallic superconductors has been proposed in which the intermetallic compound is produced by forming an assembly of one component of the eventual compound in intimate contact with a non-superconductive sheath of a stabilishing material such as copper, and passing the precursor so formed through a bath of the remaining component or components of the eventual intermetallic compound. The coated precursor is then heat treated to permit the coating material to diffuse into the one component to form the intermetallic compound.

Although this produces good results, it has now been discovered that compared with compounds prepared from virgin metals, there is some degradation of the properties of the compound prepared using this route. It has also now been discovered that this is caused by some diffusion of the non-superconductive metal into the one component and into the compound.

SUMMARY OF THE INVENTION

By the present invention there is provided a method of manufacturing a superconductor of an intermetallic compound which includes the steps of providing an assembly of at least one component of an eventual intermetallic superconductive compound surrounded by and in intimate contact with a material which is not superconductive at 4.2°K, diffusing the remaining component or components through the non-superconductive material into the at least one component, characterised in that there is provided a selective diffusion barrier between the at least one component and the non-superconductive material, through which the remaining component or components can diffuse, but which substantially blocks the passage of non-superconductive material into the at least one component.

The non-superconductive material may be a stabilising material. The remaining component or components may be added to the outside of the assembly and diffused through, or may be incorporated in the non-superconductive material to form an alloy therewith prior to assembly. The remaining component or components may be added to the outside in a first operation and diffused through in a subsequent operation.

The selective diffusion barrier is one which dissolves or forms compounds with those components which have to pass through it, but in which the non-superconductive component is substantially insoluble at temperatures up to and including the temperatures of processing and heat treatment of the assembly. The barrier may be formed of one or more materials.

The assembly may be in the form of a wire, tape, tube or other extended configuration. The non-superconductive metal may be chosen from the group copper, silver, nickel plus copper, magnesium, iron, the barrier being respectively tantalum, niobium, zirconium plus tantalum, hafnium, and zirconium.

The assembly may be elongated prior to the heat treatment stage used to form the intermetallic compound. The elongation may be carried out at elevated temperatures which are lower than the temperature of said heat treatment.

Preferably the remaining component or components is or are the more reactive metal(s) under the heat treatment conditions and for the composition prevailing during reaction. The heat treatment to provide diffusion is preferably carried out at such a temperature that none of the metals or constituents of the assembly is in the liquid phase. Thus the alloy of the non-superconductor metal and the more highly reactive constituent will normally have a lower melting point than that of the remainder of the constituents, and will be reacted at slightly below that melting point.

Alternatively the heat treatment to provide diffusion is carried out at such a temperature that said alloy is molten, in which case it must be contained by a solid component, for example by said remainder of the constituents of the intermetallic compounds.

The at least one component may be in the form of a filament in a matrix of the alloy, or the at least one component may surround the alloy.

The conductor of the invention can incorporate additional stabilising non-superconductor material, for example as cores of filaments of the remainder of the components of the intermetallic compound, or by being cabled in wires of stabilising metal. The conductor can also be reinforced by incorporating reinforcement filaments or being cabled with the latter.

BRIEF DESCRIPTION OF THE DRAWINGS

By way of example, embodiments of the invention will now be described with reference to the accompanying drawings of which.

DESCRIPTION OF THE PREFERRED EMBODIMENTS

Figure 1:
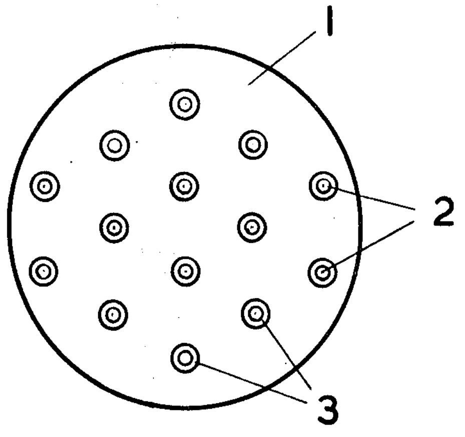
FIG. 1 is a cross-section not to scale of a superconductor assembly.

Considering FIG. 1, the wire illustrated comprises a copper matrix 1 embedded in which is a series of niobium filaments 2 which are surrounded by tantalum diffusion barriers 3. The assembly is made by inserting a niobium rod sheathed in a tantalum tube into a copper can, evacuating and sealing the can, and then extruding the assembled can to form a series of rods. These rods are then cut into pieces and either inserted into a block of copper having holes drilled for their location or inserted into a can of copper together with the other copper rods to produce a sub-assembly.

This can is then evacuated and sealed and the assembly extruded at a temperature of approximately 750°C to form a composite rod which is then swaged and drawn to produce a wire with filaments located as shown in the drawing. The approximate diameter of the niobium filaments would typically be less than 10 microns and might normally be of the order of 2 microns. In the final assembly, the thickness of the tantalum barrier would be a few tenths of a micron, typically 0.2 micron. The assembled wire or precursor is then passed through a tank of molten tin permitting tin to solidify or the surface of the precursor to form a coating thereon. The thus coated body is then passed into a furnace which has an argon atmosphere at a temperature of 800°C. The tin rapidly diffuses into the copper and through it to contact the tantalum. The assembly is then further heat treated at a temperature of approximately 700°–800°C for 10 to 20 hours during which time the tin reacts with the tantalum to form the intermetallic compound $Ta_3Sn$. The tin migrates through the tantalum in the form of this intermetallic compound to react with the niobium filaments to form the superconducting intermetallic $Nb_3Sn$. Since copper is almost totally insoluble in tantalum, there is no reaction between the copper in the bronze matrix and the tantalum diffusion barrier so that no copper passes through it into the niobium filaments. The copper also has a very small solubility in the $Ta_3Sn$ intermetallic compound, and consequently little copper passes through that either.

The effect of the tantalum barrier is therefore to prevent copper contaminating the eventual $Nb_3Sn$ produced, resulting in a high quality product with good superconductive properties.

In an alternative method of forming a filamentary superconductor illustrated in FIG. 1, the copper matrix 1 may be replaced by a bronze matrix of copper plus 10wt% tin. The assembly would be made in a similar manner to that described above, except that bronze cans would be used to sheathe the niobium rods and these rods would then be either inserted into a block of bronze or into a further can of bronze. Again the can would be evacuated, sealed, extruded, swaged and drawn to wire. The assembly would then be heated at a temperature of approximately 700° to 800°C for 10 to 20 hours to produce a similar reaction to that described above.

Figure 2:
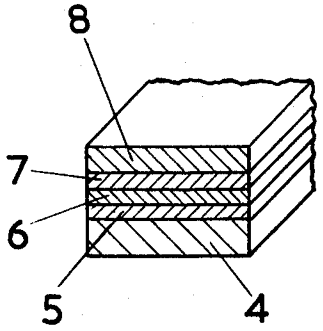
FIG. 2 is a perspective view not to scale of a tape assembly.

Considering the tape embodiment illustrated in FIG. 2, the tape is formed by preparing a sandwich of silver base 4 with a niobium interlayer 5 separating the base from an alloy 6 of silver plus 10wt% germanium. On top of the layer 6 is a further layer 7 of niobium and then on top of this is a layer 8 of vanadium. These layers may be built up to any number as required, and may also be located beneath the base 4 in a mirror image formation. The outer layers may be reinforced with further silver layers. It will of course be appreciated that the position of the silver-germanium alloy layer and the vanadium layer may be reversed if required. The assembly is prepared by thoroughly surface cleaning individual tapes of the components and then roll-bonding them together either two at a time and recombining or by assembling the whole in a single rolling operation. Normally the rolling operation further extends the composite to produce a uniform arrangement.

During the heat treatment stage, the germanium reacts with the niobium to form $Nb_3Ge$ and the germanium then diffuses through the niobium to form $V_3Ge$ in the vanadium layer. Since the silver is virtually insoluble in the niobium and in the $Nb_3Ge$ compound, no reaction with it occurs and hence the silver does not contaminate the $V_3Ge$ formed.

Figure 3:
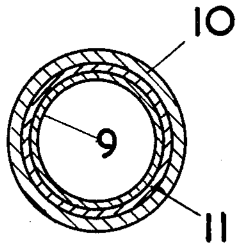
FIG. 3 is a cross-section not to scale of a tube.

Referring to FIG. 3, a central tube 9 of an alloy austenitic stainless steel Fe 18wt% Cr, 8wt% Ni, 0.08wt% C plus 5wt% gallium is separated from an outer vanadium tube 10 by means of a barrier tube 11 of zirconium. Normally such an arrangement would be prepared by co-processing tubes of the alloy, the zirconium and the vanadium starting from an initially extruded composite and drawing using a floating plug technique.

When the material is reacted together, the gallium reacts with the zirconium to form $ZrGa_3$. The gallium then diffuses through the zirconium to form $V_3Ga$ in the vanadium tube. Since iron, nickel and chromium are almost totally insoluble in zirconium (chromium below 830°C) with a maximum solubility of approximately 0.02wt% at 800°C for iron, and are also of low solubility in $ZrGa_3$, no reaction between the iron, nickel and chromium and the zirconium occurs and hence the iron, nickel and chromium do not pass into the vanadium tube to contaminate the $V_3Ga$ thus formed.

Figure 4:
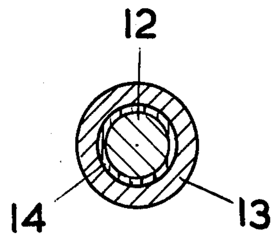
FIG. 4 is a cross-section not to scale of a single wire.

Considering the embodiment illustrated in FIG. 4, a central core 12 of magnesium plus 5wt% aluminium is separated from a surrounding tube 13 of niobium by a barrier 14 of hafnium. Again the assembly is produced by coprocessing at an elevated temperature a rod of magnesium-aluminium alloy surrounded by hafnium and niobium tubes to produce a metallurgically-bonded assembly as illustrated in the drawing. The material is desirably processed at a relatively low temperature for the alloy magnesium plus 5wt% aluminium has a relatively low melting point. However, since the alloy is surrounded by a higher melting point material such as niobium, the temperature of processing can be made above the melting point of the magnesium/aluminium if this has processing advantages such as rapid reduction in section. During the reaction stage, the aluminium reacts with the hafnium to form $HfAl_3$ and the aluminium then diffuses through the hafnium to form $Nb_3Al$ in the surrounding niobium tube. Since magnesium is virtually insoluble in hafnium and also in $HfAl_3$, the magnesium does not contaminate the $Nb_3Al$ formed eventually. Also using the arrangement illustrated the alloy may if necessary be melted to enable the heat treatment temperature to be raised and speed up the reaction. The alloy would be kept in the niobium tube by virtue of capillary action.

Figure 5:
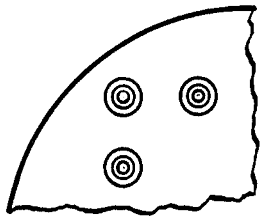
FIG. 5 is a cross-section not to scale of a portion of a wire using a double barrier.

In the embodiment illustrated in FIG. 5, niobium filaments are embedded in a nickel plus copper plus aluminium matrix and are surrounded by a double diffusion barrier comprising a tantalum layer adjacent the niobium filaments and a further surrounding zirconium layer. The matrix alloy has the proportions nickel $_{0.63}$, copper $_{0.27}$, aluminium $_{0.1}$. The diffusion barrier works by each of the components blocking one of the components of the matrix alloy which would contaminate the eventual superconductor. The aluminium reacts with the zirconium to form a range of intermetallic compounds from $Zr_3Al$ to $ZrAl_3$; the copper also diffuses through the zirconium but the nickel being insoluble in zirconium does not pass into it. The aluminium being also soluble in the tantalum layer, forming $TaAl_3$, diffuses through the tantalum to reach the niobium filaments to form $Nb_3Al$. However, as the copper is almost completely insoluble in the tantalum, it does not pass through it and hence does not contaminate the $Nb_3Al$.

The mixed outside matrix of copper plus nickel for the aluminium is better than either metal on its own. The copper reduces the ferro-magnetic properties of the nickel and the nickel raises the melting point of the copper-aluminium alloy to reasonable levels for the purposes of processing. The processing can in fact be carried out at temperatures of the order of 800°C.

Although the invention has been described with reference to five particular embodiments, it will be appreciated that the structural arrangement could be used with any of the combinations of the materials described. Also other diffused barrier and reaction component systems could be used, the requirement only being that the diffusion barrier is penetrable by the component which has to pass through it and which is impenetrable by whatever matrix material is required not to pass into the eventual superconductor.

I claim:

1. A method of manufacturing a superconductor of an intermetallic compound which includes the steps of:

i. forming an assembly of
   a. at least one component of an eventual intermetallic superconductive compound,
   b. said at least one component being surrounded by and in intimate contact with a stabilising material non-superconductive at 4.2°K,
   c. there being a selective diffusion barrier between the at least one component and the non-superconductive stabilising material;

ii. providing the remaining component or components in the stabilising material;

iii. then heating the assembly in order to diffuse the remaining component or components through the stabilising material and through the selective diffusion barrier, the selective diffusion barrier substantially blocking the passage of the stabilising material into the at least one component; and subsequently iv. heat treating the assembly to react the remaining component or components with the one component to form the intermetallic compound, the remaining component or components being the more reactive metal under the heat treatment conditions and for the composition prevailing during reaction.

2. A method as in claim 1 wherein the non-superconductive metal is selected from the group consisting of copper, silver, nickel plus copper, magnesium and iron and wherein the selective diffusion barrier is selected from the group consisting of tantalum, niobium, zirconium plus tantalum, hafnium and zirconium.

3. A method as claimed in claim 1 in which the remaining component or components are added to the outside of the assembly and diffused through.

4. A method as claimed in claim 1 in which the remaining component or components are incorporated in the non-superconductive material to form an alloy therewith prior to the assembly.

5. A method as claimed in claim 3 in which the remaining component or components are added to the outside in a first operation and diffused through in a second operation.

6. A method as claimed in claim 1 in which the selective diffusion barrier is formed of a single material.

7. A method as claimed in claim 1 in which the selective diffusion barrier is formed of a plurality of materials.

8. A method as claimed in claim 1 in which the assembly is in the form of a wire, tape, tube or other extended configuration.

9. A method as claimed in claim 8 in which the assembly is elongated prior to the heat-treatment stage used to form the intermetallic compound.

10. A method as claimed in claim 9 in which the elongation is carried out at elevated temperatures lower than the temperature of said heat treatment.

11. A method as claimed in claim 1 in which the heat treatment to provide diffusion is carried out at such a temperature that none of the metals or constituents of the assembly is in the liquid phase.

12. A method as claimed in claim 4 in which the heat treatment to provide diffusion is carried out at a temperature above the melting point of the alloy, the alloy being constrained by a solid component.

13. A method as claimed in claim 12 in which the solid component is the remainder of the constituents of the intermetallic compound.

14. A method as claimed in claim 4 in which the at least one component is in the form of at least one filament in a matrix of the alloy.

15. A method as claimed in claim 4 in which the at least one component surrounds the alloy.

16. A method as claimed in claim 1 in which the conductor incorporates additional stabilising non-superconductor material.

17. A method as claimed in claim 16 in which the additional material is included as cores of filaments of the remainder of the components of the intermetallic compound.

18. A method as claimed in claim 16 in which the conductor is cabled with wires of stabilising metal.

19. A method as claimed in claim 1 in which the conductor is reinforced with reinforcing filaments or by being cabled with reinforcing filaments.

* * * * *